(12) United States Patent  (10) Patent No.: US 7,858,964 B2
Knoefler et al.  (45) Date of Patent: Dec. 28, 2010

(54) SEMICONDUCTOR DEVICE FORMED IN A RECRYSTALLIZED LAYER

(75) Inventors: Roman Knoefler, Fishkill, NY (US); Armin Tilke, Beacon, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/368,122

(22) Filed: Feb. 9, 2009

(65) Prior Publication Data

US 2009/0146146 A1  Jun. 11, 2009

Related U.S. Application Data

(62) Division of application No. 11/180,432, filed on Jul. 13, 2005, now Pat. No. 7,488,670.

(51) Int. Cl.
H01L 31/00 (2006.01)
H01L 29/00 (2006.01)
H01L 27/108 (2006.01)

(52) U.S. Cl. .............. 257/19; 257/20; 257/65; 257/69; 257/70; 257/369; 257/374; 257/513; 257/616; 257/E29.252; 257/E21.545; 257/E21.574

(58) Field of Classification Search .............. 257/19, 257/20, 64, 65, 69, 70, 190, 352, 369, 616, 257/E29.252, 374, 513
See application file for complete search history.

(56) References Cited

U.S. PATENT DOCUMENTS

| | | | |
|---|---|---|---|
| 5,447,884 A | 9/1995 | Fahey et al. | |
| 5,693,546 A | 12/1997 | Nam et al. | |
| 5,792,679 A | 8/1998 | Nakato | |
| 5,972,761 A | 10/1999 | Wu | |
| 5,989,978 A | 11/1999 | Peidous | |
| 6,046,487 A | 4/2000 | Benedict et al. | |
| 6,069,049 A | 5/2000 | Geiss et al. | |
| 6,271,068 B1 | 8/2001 | Hsu et al. | |
| 6,573,172 B1 | 6/2003 | En et al. | |
| 6,657,276 B1 | 12/2003 | Karlsson et al. | |
| 6,730,583 B2 | 5/2004 | Oh et al. | |

(Continued)

FOREIGN PATENT DOCUMENTS

DE  10 2006 030 647 A1  2/2007

(Continued)

OTHER PUBLICATIONS

Jae-Geun, O., et al., "Method for Fabricating Semiconductor Device," Mar. 11, 2003, Hynix Semiconductor Inc., Taiwan English Abstract of TW523869B, 1 Page.

(Continued)

Primary Examiner—Walter L Lindsay, Jr.
Assistant Examiner—Ron Pompey
(74) Attorney, Agent, or Firm—Slater & Matsil, L.L.P.

(57) ABSTRACT

A semiconductor device includes a substrate that includes a first layer and a recrystallized layer on the first layer. The first layer has a first intrinsic stress and the recrystallized layer has a second intrinsic stress. A transistor is formed in the recrystallized layer. The transistor includes a source region, a drain region, and a charge carrier channel between the source and drain regions. The second intrinsic stress is aligned substantially parallel to the charge carrier channel.

23 Claims, 5 Drawing Sheets

U.S. PATENT DOCUMENTS

| | | |
|---|---|---|
| 6,808,970 B2 | 10/2004 | Feudel et al. |
| 6,890,808 B2 | 5/2005 | Chidambarrao et al. |
| 6,900,502 B2 | 5/2005 | Ge et al. |
| 6,939,814 B2 | 9/2005 | Chan et al. |
| 6,943,391 B2 | 9/2005 | Chi et al. |
| 6,952,289 B1 | 10/2005 | Fujimoto et al. |
| 6,972,247 B2 | 12/2005 | Bedell et al. |
| 7,094,671 B2 | 8/2006 | Li |
| 7,105,394 B2 | 9/2006 | Hachimine et al. |
| 7,169,659 B2 | 1/2007 | Rotondaro et al. |
| 7,307,273 B2 * | 12/2007 | Currie .................. 257/18 |
| 7,488,670 B2 | 2/2009 | Knoefler et al. |
| 2002/0055241 A1 | 5/2002 | Oh et al. |
| 2003/0146494 A1 | 8/2003 | Puchner et al. |
| 2003/0181005 A1 | 9/2003 | Hachimine et al. |
| 2003/0227036 A1 | 12/2003 | Sugiyama et al. |
| 2004/0212035 A1 | 10/2004 | Yeo et al. |
| 2004/0221792 A1 * | 11/2004 | Forbes .................. 117/4 |
| 2004/0232513 A1 | 11/2004 | Chi et al. |
| 2004/0251479 A1 | 12/2004 | Tsutsui et al. |
| 2005/0124146 A1 | 6/2005 | Bedell et al. |
| 2005/0136583 A1 | 6/2005 | Chen et al. |
| 2005/0196925 A1 * | 9/2005 | Kim et al. .................. 438/285 |
| 2005/0224798 A1 | 10/2005 | Buss |
| 2005/0255667 A1 | 11/2005 | Arghavani et al. |
| 2005/0260806 A1 | 11/2005 | Chang et al. |
| 2006/0099765 A1 | 5/2006 | Yang |
| 2007/0012960 A1 | 1/2007 | Knoefler et al. |
| 2007/0190741 A1 | 8/2007 | Lindsay |
| 2007/0275522 A1 | 11/2007 | Yang |
| 2009/0050981 A1 | 2/2009 | Tsutsui et al. |

FOREIGN PATENT DOCUMENTS

| | | |
|---|---|---|
| JP | 9-219524 | 8/1997 |
| JP | 2009-219524 | 8/1997 |
| JP | 2003-273240 | 9/2003 |
| JP | 2005-005633 A | 1/2005 |
| WO | WO 2004/061921 A2 | 7/2004 |
| WO | WO 2005/055290 A2 | 6/2005 |
| WO | WO 2006/053258 | 5/2006 |
| WO | WO 2006/053258 A2 | 5/2006 |

OTHER PUBLICATIONS

Chi, M.-H., et al., "Modification of Carrier Mobility in a Semiconductor Device," Jun. 1, 2005, Taiwan Semiconductor Manufacturing Co. Ltd., English Abstract of TW 200518239, 1 Page.

Chen, C.H., et al., "Advanced Strained-Channel Technique to Improve CMOS Performance," Jul. 1, 2005, Taiwan Semiconductor Manufacturing Co. Ltd., English Abstract of TW 200522348, 1 Page.

Chen, C-H, et al., "Stress Memorization Technique (SMT) by Selectively Strained-Nitride Capping for Sub-65nm High-Performance Strained-Si Device Application," 2004 Symposium on VLSI Technology Digest of Technical Papers, 2004, pp. 56-57, IEEE.

Chan, V., et al., "Strain for CMOS performance Improvement," IEEE 2005 Custom Integrated Circuits Conference, 2005, pp. 667-674, IEEE.

Tsaur, B-Y., et al., "Stress-Enhanced Carrier Mobility in Zone Melting Recrystallized Polycrystalline Si Films on $SiO_2$-Coated Substrates," Applied Physics Letters, Feb. 15, 1982, 3 pages, American Institute of Physics.

* cited by examiner

SEMICONDUCTOR DEVICE FORMED IN A RECRYSTALLIZED LAYER

This is a divisional application of U.S. application Ser. No. 11/180,432, entitled "Direct Channel Stress", which was filed on Jul. 13, 2005 now U.S. Pat. No. 7,488,670 and is incorporated herein by reference.

TECHNICAL FIELD

This invention relates generally to semiconductor devices, and more particularly to devices and methods for modulating stress in transistors in order to improve performance.

BACKGROUND

Semiconductor devices are used in a large number of electronic devices such as computers, cell phones and others. One of the goals of the semiconductor industry is to continue shrinking the size and increasing the speed of individual devices. Smaller devices can operate at higher speeds since the physical distance between components is smaller. In addition, higher conductivity materials such as copper are replacing lower conductivity materials such as aluminum. One other challenge is to increase the mobility of semiconductor carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility and performance boost of devices. For example, stress can be provided by a contact etch stop layer (CESL), single layers, dual layers, stress memory transfer layers, and STI liners. Most of these techniques use nitride layers to provide tensile and compressive stresses. In other applications, oxide layers can be used.

One drawback of stress layers deposited on top of transistor structures is that the distance between the stressor and the transistor channel partially relaxes the applied strain. Additionally, and especially in small devices, contact holes penetrating the stress layer reduce the total area of the stress layer, thereby reducing the performance enhancement.

In light of these and other problems, there remains a need for improved structures and methods for creating performance-enhancing strain in semiconductor devices.

SUMMARY OF THE INVENTION

These and other problems are generally solved or circumvented, and technical advantages are generally achieved, by preferred embodiments of the present invention that provides methods and structures forming strained regions in semiconductor devices.

An embodiment of the invention provides a semiconductor fabrication method. The method comprises forming a strained channel region in semiconductor devices. Embodiments include forming a stressor layer over an amorphous portion of the semiconductor device at an intermediate stage of fabrication. The device is masked and strain in a portion of the stressor layer is relaxed. Recrystallizing the amorphous portion of the intermediate device transfers strain from the stressor to the substrate. At least a portion of the strain remains in the substrate through subsequent device fabrication, thereby improving performance of the completed device. In other embodiments, a tensile stressor layer is formed over a first portion of the device, and a compressive stressor layer is formed over a second portion. A tensile stressor layer forms a compressive channel in a PMOS device, and a compressive stressor forms a tensile channel in an NMOS device.

Another embodiment of the invention provides a semiconductor device. The device comprises a substrate, wherein the substrate comprises a first layer and a recrystallized layer on the first layer. Preferably, the first layer has a first intrinsic stress and the recrystallized layer has a second intrinsic stress, which may be different from the first intrinsic stress. Embodiments further include a transistor formed in the recrystallized layer, the transistor comprising a source region, a drain region, and a charge carrier channel between the source and drain regions. In preferred embodiments the second intrinsic stress is aligned substantially parallel to the charge carrier channel.

In embodiments of the invention the transistor comprises an n-channel transistor and the second intrinsic stress is tensile. In other embodiments, the transistor comprises a p-channel transistor and the second intrinsic stress is compressive.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numbers and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts, which are not to be limited to the exemplary embodiments provided herein.

The invention will now be described with respect to preferred embodiments in a specific context, namely n-channel and p-channel transistors in a CMOS device. Embodiments of the present invention may also be applied, however, to other semiconductor or integrated circuit applications where one or more recessed gate transistors are utilized. Note that the illustrative embodiments include only one PMOS device and one NMOS device. However, there are typically many (e.g., thousands or millions) PMOS and NMOS devices formed on a semiconductor substrate during each of the manufacturing processes described herein.

Figure 1:
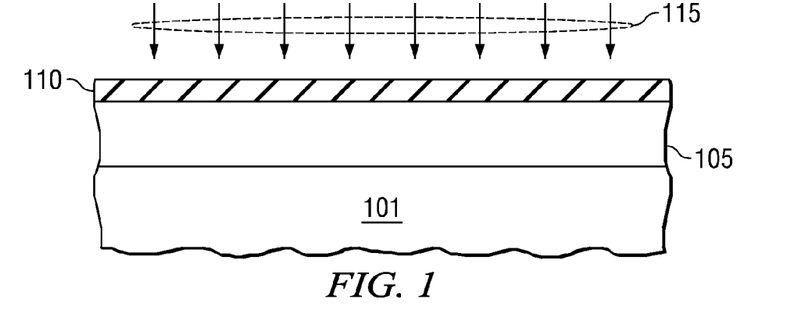
FIG. 1 is a side view of an embodiment of the invention illustrating converting a portion of a semiconductor substrate to an amorphous layer.

Turning now to FIG. 1, there is illustrated an embodiment of the invention, which includes a substrate 101, such as silicon or other semiconductor materials. The substrate 101 may comprise a single crystal silicon substrate or a single crystal silicon layer over another semiconductor (e.g., Si, SiGe, SiC) or an insulator (e.g., a silicon-on-insulator or SOI substrate). Compound or alloy semiconductors, such as GaAs, InP, SiGe, or SiC, as examples, can be used in place of silicon. As is typical of semiconductor materials, the substrate 101 is generally not stress free; therefore, it may have an intrinsic stress, which may be either compressive or tensile.

Formed over the substrate 101 is a pad oxide layer 110. The pad oxide layer 110 is preferably silicon dioxide about 50 Angstroms thick and may be formed by thermal oxidation.

After forming the pad oxide layer 110, a portion of the substrate 101 is converted to an amorphous layer 105. The amorphous layer 105 is preferably formed by disrupting a portion of the crystalline lattice of the substrate 101 near its surface region, i.e., the region adjacent the pad oxide layer 110. This process, which may be referred to as amorphisation, is accomplished using an ion implant 115, preferably using germanium at about 1E14 to 1E15 $cm^2$, at about 20 to 40 keV. The amorphous layer 105 is preferably about 20 to 50 nm. The amorphous layer 105 may also be referred to as a stress transfer layer. For, as will be clear from the discussion below in connection with preferred embodiments of the invention, the amorphous layer's 105 functions include transferring an intrinsic stress from a stressor layer to the substrate 101.

Figure 2:
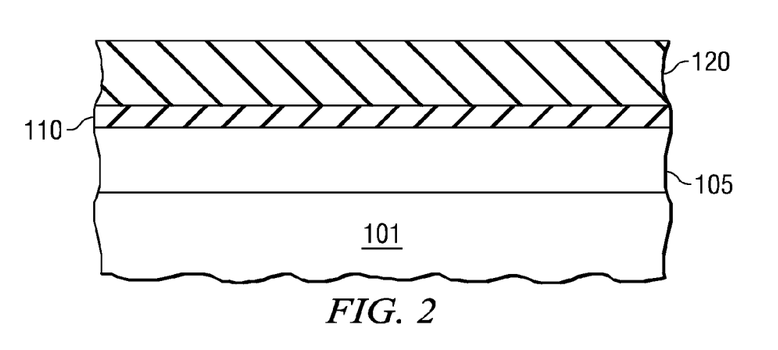
FIG. 2 illustrates forming a stressor layer over the amorphous layer.

Turning to FIG. 2, formed over the pad oxide layer 110 is a stressor layer 120, which preferably is simultaneously used as a pad nitride. The stressor layer 120 preferably comprises silicon nitride, which may be deposited having an intrinsic tensile or compressive stress by adjusting the stoichiometry of the material and/or the process conditions by which the film is deposited. Preferably, the stressor layer 120 is a plasma enhanced chemical vapor deposited (PECVD) silicon nitride layer between about 500 to 1500 Å thick, silicon nitride, although the stressor layer 120 may comprise other materials and thicknesses.

Figure 3:
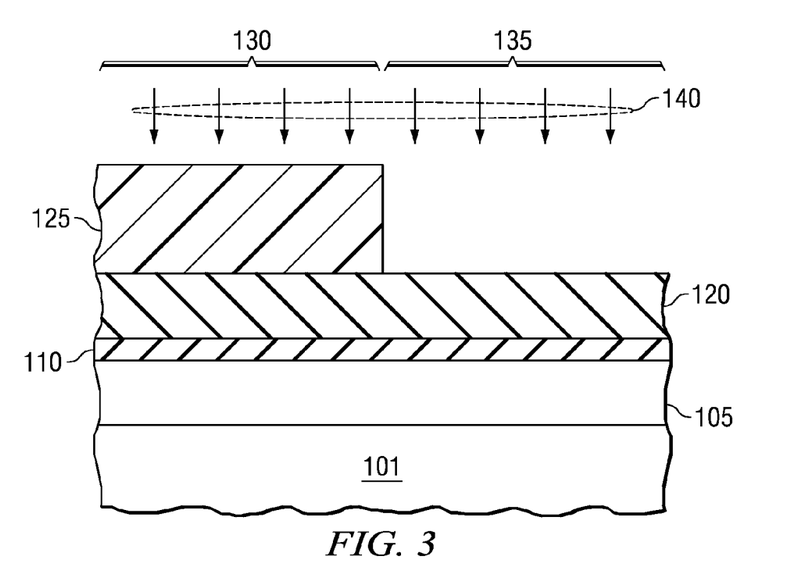
FIG. 3 illustrates stress relaxation in a portion of the stressor layer.

Turning now to FIG. 3, using a resist 125, the structure of FIG. 2 is masked to form a first region 130 and a second region 135. A relaxation implant 140 is performed in order to modulate the stress in the stressor layer 120. The relaxation implant 140 modifies the stressor layer 120 selectively in the second region 135 by breaking chemical bonds and/or by adjusting the composition. Implant conditions may comprise those used in the amorphisation implant described above, e.g., a germanium implant. The relaxation implant 140 preferably relaxes the stress within the stressor layer 120; however, implants that increase the stress are also within the scope of embodiments of the invention.

As noted, the structure of FIG. 3 includes the first region 130 and the second region 135. Through the relaxation implant 140, the magnitude of the stress within the second region 135 is changed, e.g., reduced, relative to the magnitude of the stress within the first region 130. For example, a stressor layer 120 initially having a uniform tensile stress distribution is less tensile (or more compressive) in the second region 135 after the relaxation implant 140. Similarly, a stressor layer 120 initially having a uniform compressive stress distribution is less compressive (or more tensile) in the second region 135 after the relaxation implant 140.

In embodiments of the invention, an as-deposited stressor layer 120 may have an intrinsic stress magnitude up to or greater than about 3 GPa, while the relaxed stress is preferably much less. Preferably, the as-deposited stress in the stressor layer 120 is about 1 to 1.6 GPa in a tensile layer and about 2 to 3 GPa in a compressive layer. After the relaxation implant 140, the magnitude of the intrinsic stress in the stressor layer 120 is preferably less than about 100 MPa. Other stress magnitudes are within embodiments of the invention as well.

Figure 4:
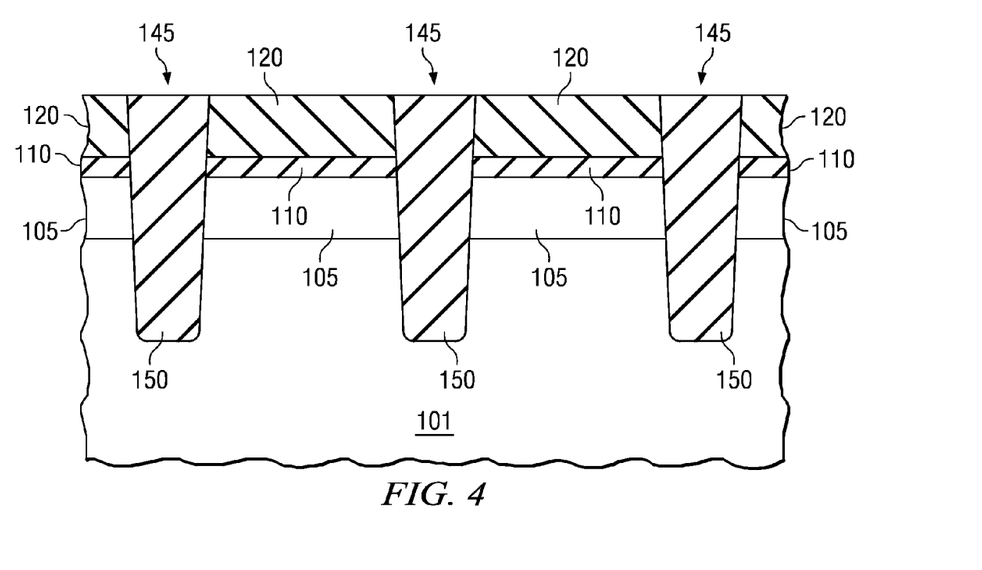
FIG. 4 illustrates STI formation in the structure of FIG. 3.

Next, as shown in FIG. 4, after removing the resist 125, a plurality of isolation trenches 145, preferably shallow trench isolation regions, are formed through the stressor layer 120, the pad oxide layer 110, the amorphous layer 105, and into the surface of the substrate 101. Preferably, the isolation trenches 145 are formed, to a depth between about 300 nm and 500 nm.

The isolation trenches 145 are filled with a trench filling material 150, which may comprise an oxide such as silicon dioxide. In one embodiment, the oxide is deposited using a high density plasma (HDP) process. In another embodiment, the oxide can be deposited by the decomposition of tetraethyloxysilane (TEOS) based processes. In other embodiments, other materials can be used. For example, a trench filling material may be amorphous or polycrystalline (doped or undoped) silicon or a nitride such as silicon nitride. In other embodiments (not illustrated), sidewalls of the trench may include a liner. For example, an oxide and/or a nitride liner (not shown) may be formed between the trench filling material and the material comprising the substrate 101. Other isolative techniques (e.g., field oxide or deep trench isolation) are also possible.

In embodiments of the invention, stress is transferred from the stressor layer 120 to the underlying layers, i.e., the pad oxide layer 110, the amorphous layer 105, and the substrate 101. In embodiments of the invention, the type of stress within the amorphous layer 105 is opposite the stress in the stressor layer 120. For example, a tensile stressor layer 120 will tend to induce a compressive strain within an underlying amorphous layer 105, while a compressive stressor layer 120 will create a tensile strain in an underlying amorphous layer 105.

Figure 5:
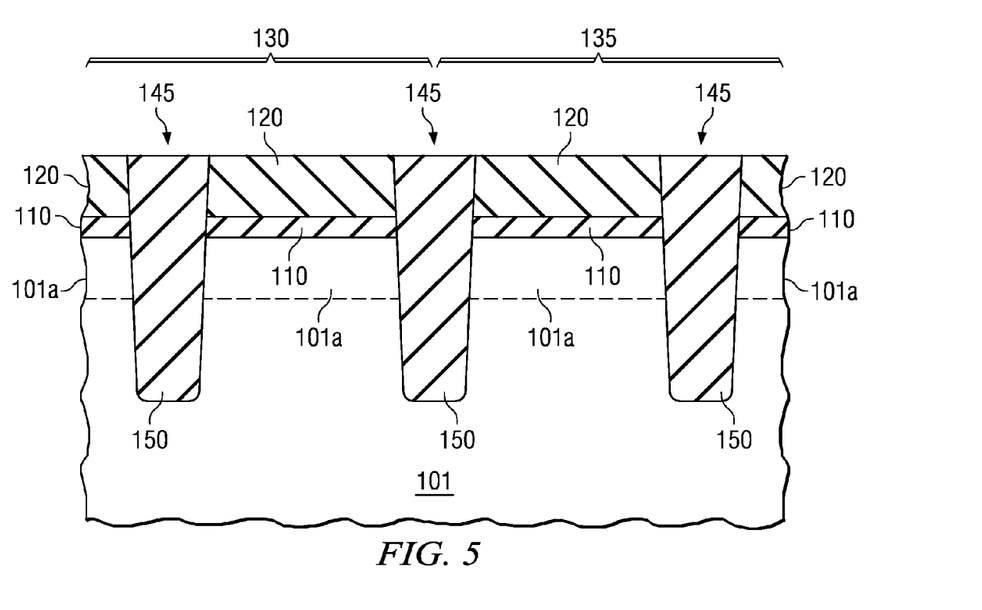
FIG. 5 illustrates recrystallization of the amorphous layer.

After the relaxation implant 140, preferred embodiments of the invention include a processing step that causes recrystallization of the amorphous layer 110. This preferred step produces a recrystallized layer 101A, as illustrated in FIG. 5. During the recrystallizing, grain growth preferably proceeds from inside the substrate 101 outward. Therefore, the recrystallized layer 101A most preferably has the same crystal orientation as the substrate 101 and is perfectly aligned to the substrate, although the same orientation is not required of all embodiments of the invention. Since the recrystallized layer 101A is formed under high stress conditions, the intrinsic stress remains high in the recrystallized layer 101A, even after the stressor layer 120 is removed. Recrystallizing the amorphous layer 105 is accomplished with a heat treatment, such as an rapid thermal process (RTP) spike anneal at about 1000 to 1100° C. for about 1 second, or longer.

Figure 6:
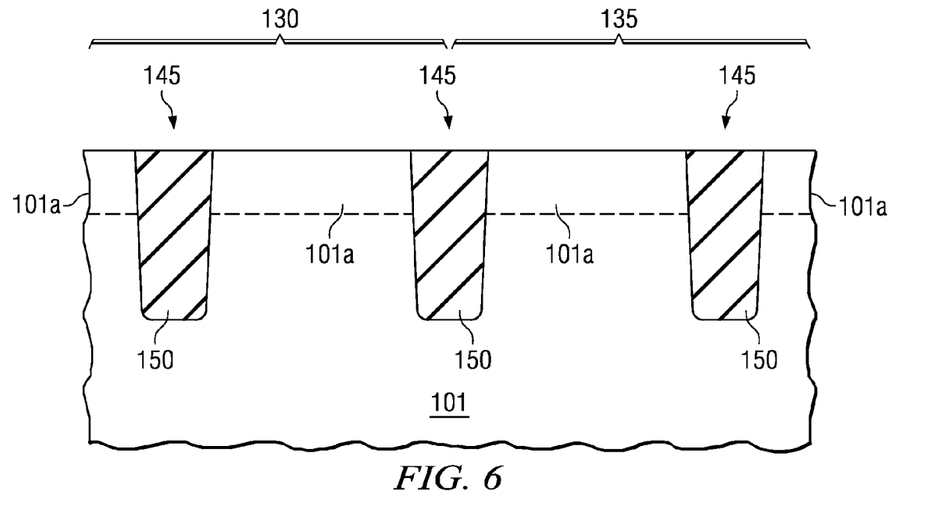
FIG. 6 illustrates planarization of the structure of FIG. 5.

After completing the recrystallization process and the shallow trench fill, including CMP, the stressor layer 120 and the pad oxide layer 110 are removed, preferably by wet etching, thereby resulting in the structure illustrated in FIG. 6. Further illustrated is the recrystallized portion of the substrate 101A. After forming the structure of FIG. 6, further processing yields a suitable semiconductor device having a stress/strain distribution for improving device performance.

Figure 7:
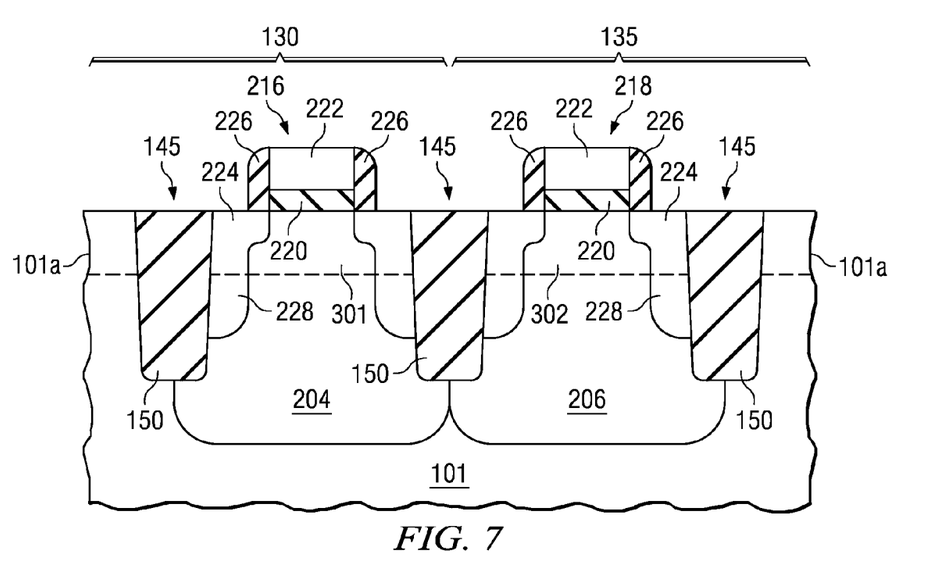
FIG. 7 illustrates a CMOS device formed according to embodiments of the invention.

In one example of an illustrative embodiment, FIG. 7 shows the structure of FIG. 6 after further processing to form a CMOS device. Formed in the first region 130 is an NFET 301, and formed in the second region 135 is a PFET 202. This comprises forming within the substrate 101, a first active area 204 and a second active area 206. In the CMOS example that will be described, a p-channel transistor (PMOS) will be formed in the first active area 204 and an n-channel transistor (NMOS) will be formed in the second active area 206. As such, the first active area 204 is lightly doped with n-type dopants and the second active area 206 is lightly doped with p-type dopants. In other embodiments, other devices can be formed. For example, other NMOS transistors, other PMOS transistors, bipolar transistors, diodes, capacitors, resistors and other devices can be formed in active areas similar to 204 and 206.

As shown in FIG. 7, the first region 204 and the second region 206 are separated by isolation regions, such as an STI region 145, formed in the substrate 101. The STI region 145 is filled with a trench filling material, which may comprise an oxide such as silicon dioxide. In one embodiment, the oxide is deposited using a high density plasma (HDP) process. In another embodiment, the oxide can be deposited by the decomposition of tetraethyloxysilane (TEOS). In other embodiments, other materials can be used. For example, a trench filling material may be amorphous or polycrystalline (doped or undoped) silicon or a nitride such as silicon nitride. In other embodiments (not illustrated), sidewalls of the trench of the STI region 145 may include a liner. For example, an oxide and/or a nitride liner (not shown) may be formed between the trench filling material and the material comprising the substrate 101. Other isolative techniques (e.g., field oxide or deep trench isolation) are also possible.

The NFET 301 and PFET 302 devices include a gate dielectric 220, which comprises an oxide (e.g., $SiO_2$), a nitride (e.g., $Si_3N_4$), or a combination of oxide and nitride (e.g., SiN, oxide-nitride-oxide sequence). In other embodiments, a high-k dielectric material having a dielectric constant of about 5.0 or greater is used as the gate dielectric 220. Suitable high-k materials include $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 220 may comprise other high-k insulating materials or other dielectric materials. The gate dielectric 220 may comprise a single layer of material, or alternatively, the gate dielectric 220 may comprise two or more layers.

In one example, the gate dielectric 220 may be a thermally grown gate oxide. The gate dielectric 220 may also be deposited by chemical vapor deposition (CVD), metal organic chemical vapor deposition (MOCVD), physical vapor deposition (PVD), or jet vapor deposition (JVD), as examples. The gate dielectric 220 preferably comprises a thickness of about 10 Å to about 60 Å in one embodiment, although alternatively, the gate dielectric 220 may comprise other dimensions, such as about 80 Å or less, as an example.

A p-channel transistor 216 and an n-channel transistor 218 preferably further include gate electrodes 222. The gate electrode 222 preferably comprises a semiconductor material, such as polysilicon or amorphous silicon, although alternatively, other semiconductor materials may be used for the gate electrode 222. In other embodiments, the gate electrode 222 may comprise polysilicon, TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 222 comprises a doped polysilicon layer underlying a silicide layer (e.g., titanium silicide, nickel silicide, tantalum silicide, cobalt silicide, platinum silicide). A gate electrode 222 between about 1000 to 2000 Å thick may be deposited using CVD, PVD, ALD, or other deposition techniques.

After formation of the gate electrodes, lightly doped source/drain regions 224 can be implanted using the gate electrode 222 as a mask. Other implants (e.g., pocket implants, halo implants or double diffused regions) can also be performed as desired.

Spacers 226 comprising an insulating material such as an oxide and/or a nitride may be formed on the sidewalls of the gate electrode 222. The spacers 226 are typically formed by the deposition of a conformal layer followed by an anisotropic etch. The process can be repeated for multiple layers, as desired. Source/drain regions 228 can be formed in exposed surfaces of the n-well and p-well. Preferably, ions (e.g., boron for the PMOS transistor 216 and arsenic and/or phosphorus for the NMOS transistor 218) are implanted, according to conventional methods.

While not shown, it is understood that an interlayer dielectric (ILD) layer will be formed over the transistors 216 and 218. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethoxysilane (TEOS), as examples. Typically, gate electrode and source/drain contacts (not shown) are formed through the interlayer dielectric. Metallization layers that interconnect the various components are also included in the chip, but not illustrated for the purpose of simplicity.

In keeping with preferred embodiments of the invention provided herein, included between the source/drain regions 228 of the p-channel 216 and n-channel 218 transistors is a strained channel region 301. As noted above, NMOS and PMOS devices have distinct stress/strain requirements for improving performance. A tensile channel stress is most effective for NMOS devices, while a compressive channel stress is most effective for PMOS devices. Therefore, the strained channel region 301 of the p-channel transistor 216 is preferably compressive. However, so as not to degrade NMOS device performance, the strained channel region 301 of the n-channel transistor 218 is preferably less compressive (more tensile) in accordance with embodiments provided herein. In further keeping with preferred embodiments, the stress in the channel regions is aligned substantially parallel between the source/drain regions.

To summarize, embodiments of the invention provide a means of forming a strained channel region in semiconductor devices. The means includes forming a stressor layer over an amorphous portion of the semiconductor device at an intermediate stage of fabrication. The device is masked and the strain in a portion of the stressor layer is relaxed. Recrystallizing the amorphous portion of the intermediate device transfers strain from the stressor to the substrate. At least a portion of the strain remains in the substrate through subsequent device fabrication, thereby improving performance of the completed device.

The illustrative embodiments provided above expressly described only a single stressor layer. However, alternative preferred embodiments include multiple stressor layers and/or multiple stress adjustment steps. By using multiple masking, deposition, and stress adjustment steps, the stress/strain properties of NMOS and PMOS devices are more independently and selectively optimized. More specifically, alternative preferred embodiments that include multiple stressor layers and/or multiple stress adjustment steps, advantageously provide NMOS devices having tensile channel regions and simultaneously provide PMOS devices having compressive channel regions.

Figure 8:
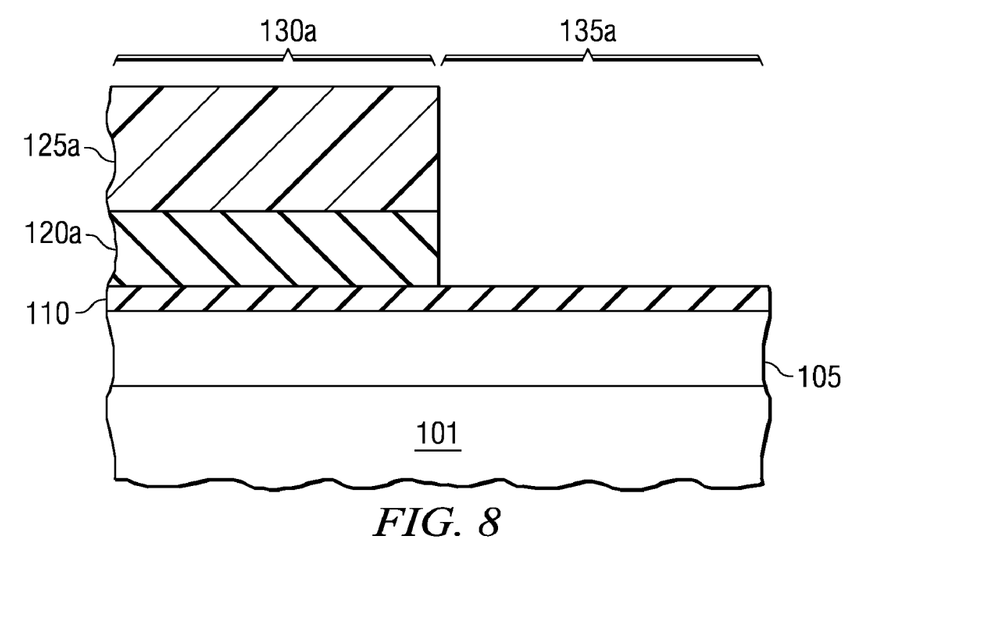
FIGS. 8-11 illustrate alternative embodiments of the invention comprising using two stressor layers for forming tensile and compressive stresses in a semiconductor device.

Turning now to FIG. 8, there is illustrated an alternative embodiment for forming strained semiconductor devices. The structure of FIG. 8 is formed according to the embodiments summarized above. Briefly, a portion of the substrate 101 is converted to the amorphous layer 105, which is covered with the pad oxide layer 110, which, in turn, is covered with a stressor layer 120a. Using a resist 125a and conventional masking and patterning methods, the structure of FIG. 8 is formed to include a first region 130a and a second region 135a by etching a portion of the stressor layer 120a through to the pad oxide layer 110, as illustrated in FIG. 8. In embodiments provided above, the strain in the stressor layer 120a is adjusted using a relaxation implant. As for the embodiment summarized in FIG. 8, however, the stress adjustment means is effected using a second stressor layer, as illustrated in FIG. 9.

Figure 9:
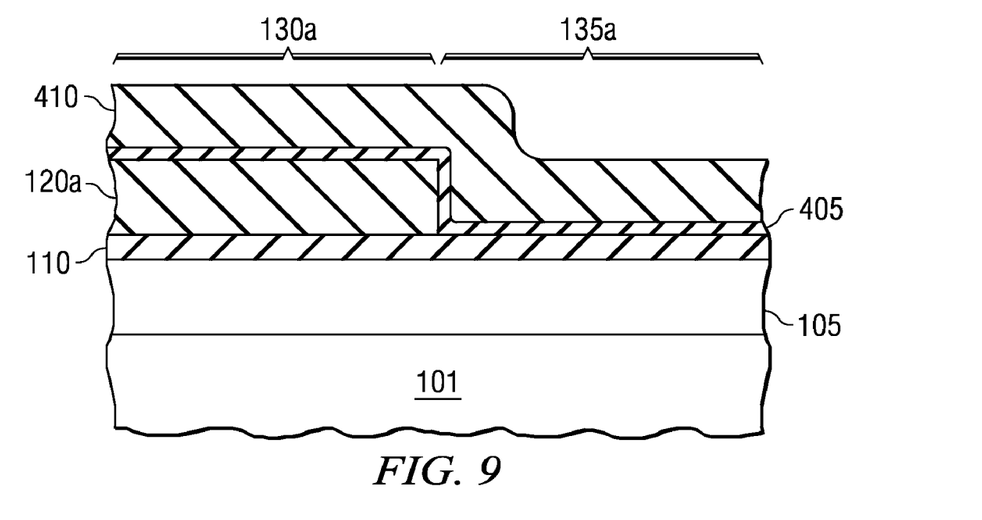

FIG. 9 includes the structure of FIG. 8, and it further includes an etch stop layer 405, which is formed over the first 130a and the second 135a regions. Formed over the etch stop layer 405 is a second stressor layer 410. In preferred embodiments of the invention, the first stressor layer 120a and the second stressor layer 410 have opposite types of stress. For example, in preparation for forming a CMOS device such as described with respect to FIG. 7, the first stressor layer 120a is highly tensile, and the second stressor layer 410 is preferably highly compressive. In light of embodiments provided above, the portion of the substrate 101 in the second region 135a is under a tensile strain, which is created by the highly compressive second stressor layer 135a.

Figure 10:
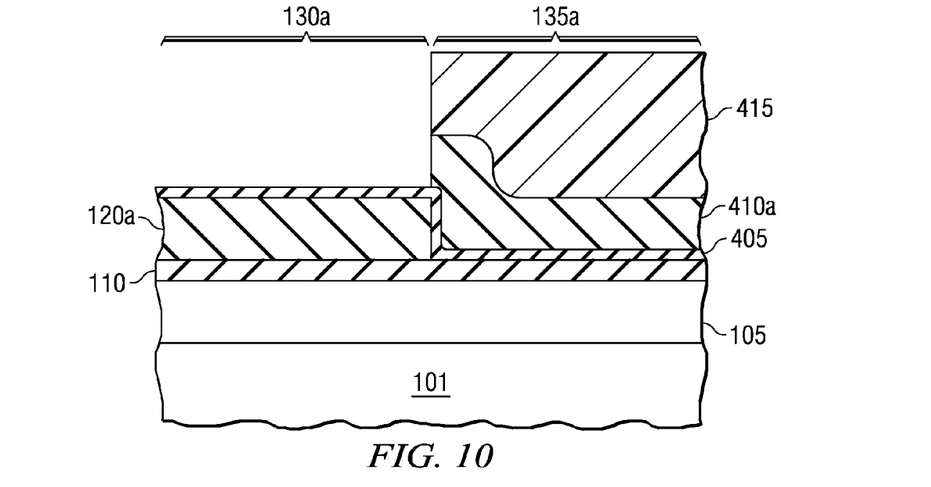

By means of a second resist layer 415, the second stressor layer 410 is removed from the first region 130a as illustrated in FIG. 10. Having removed the second stressor layer 410 from the first region 130a, the stress within the substrate 101 within this region is no longer a complex function of a stacked arrangement of stressor layers. That is, the first stressor layer 120a, which is highly tensile, induces a compressive strain in the underlying portion of the substrate 101. Likewise, the second stressor layer 410, which is highly compressive, induces a tensile strain in the respective underlying portion of the substrate 101.

Figure 11:
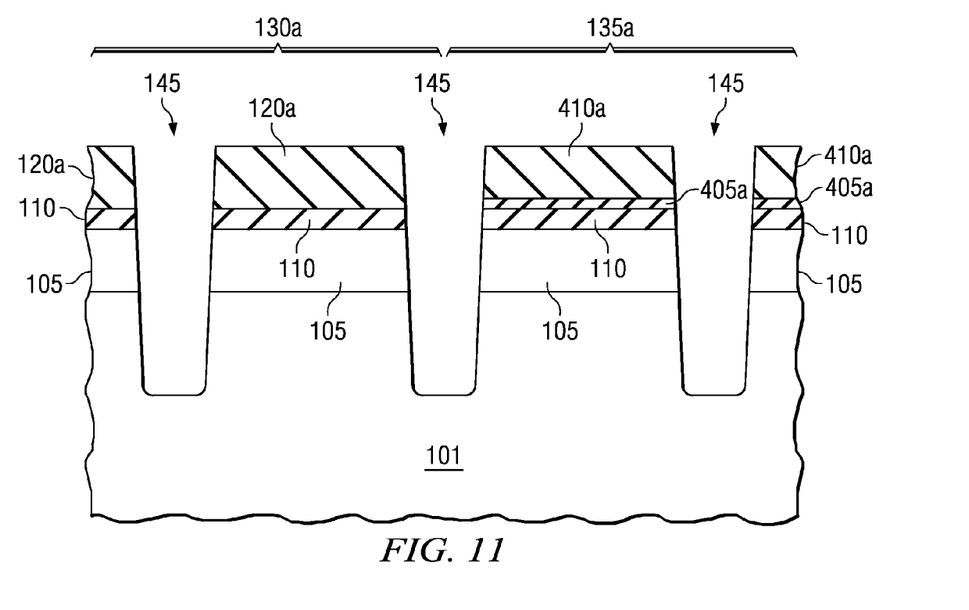

The structure of FIG. 10 is preferably further processed to include shallow trench formation, amorphous layer recrystallization, and planarization, thereby resulting in the structure of FIG. 11.

As illustrated in FIG. 11, within the first region 130a, there is formed the first stressor layer 120a over a first portion of the amorphous layer 105. The first stressor layer 120a has a first intrinsic stress that is one of compressive and tensile. A second stressor layer 410a is formed over a second portion of the amorphous layer 105 within the second region 135a. The second stressor layer 410a preferably has a second intrinsic stress that it is different than the first intrinsic stress. More preferably, the second intrinsic stress is opposite the first intrinsic stress, i.e., the other of compressive and tensile. Embodiments may further include an optional relaxation process to further adjust the stress/strain distribution. The structure of FIG. 11 may be processed further to form a CMOS device as with the embodiments provided above, see for example FIG. 7.

Although the present invention and its advantages have been described in detail, it should be understood that various changes, substitutions and alterations may be made herein without departing from the spirit and scope of the invention as defined by the appended claims. For example, it will be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A semiconductor device comprising:
   a substrate, the substrate comprising a first layer, a first recrystallized layer of a first thickness on a first portion of the first layer, and a second recrystallized layer of a second thickness on a second portion of the first layer, the first layer having a first intrinsic stress, the first recrystallized layer having a second intrinsic stress, and the second recrystallized layer having a third intrinsic stress, wherein the second intrinsic stress is larger than the first intrinsic stress and the third intrinsic stress;
   a first stressor layer over the first recrystallized layer and a second stressor layer over the second recrystallized layer, and the first and the second stressor layers, the first and second recrystallized layers are separated by an isolation trench; and wherein the isolation trench is in the first layer.

2. The semiconductor device of claim 1, wherein the first transistor comprises a p-channel transistor and the second intrinsic stress is compressive.

3. The semiconductor device of claim 2, wherein the first intrinsic stress is tensile.

4. The semiconductor device of claim 1, wherein the first layer comprises a silicon layer and wherein the first recrystallized layer comprises a recrystallized silicon layer.

5. The semiconductor device of claim 4, wherein the first layer comprises an upper portion of a single crystalline bulk substrate.

6. A semiconductor device comprising:
   a recrystallized silicon layer disposed over a substrate,
   the recrystallized silicon layer having a first portion and a second portion,
   wherein the first portion of the recrystallized silicon layer has a first intrinsic stress and the second portion of the recrystallized silicon layer has a second intrinsic stress that is smaller than the first intrinsic stress;
   a first stressor layer over the first portion of the recrystallized silicon layer;
   a second stressor layer over the second portion of the recrystallized silicon layer; and
   the first and the second stressor layers, and the first and second recrystallized layers are separated by an isolation trench, wherein the isolation trench is in the substrate.

7. The semiconductor device of claim 6, wherein the second intrinsic stress is compressive.

8. The semiconductor device of claim 7, wherein the first intrinsic stress is tensile.

9. The semiconductor device of claim 1, further comprising:
  a second transistor formed in the second recrystallized layer, the second transistor comprising a lightly doped source region, a lightly doped drain region, a source region, a drain region, and a charge carrier channel between the source and drain regions, wherein the third intrinsic stress is aligned substantially parallel to the charge carrier channel, and wherein the second thickness of the second recrystallized layer is larger than a depth of the lightly doped source region of the second transistor but less than a depth of the source region of the second transistor.

10. A semiconductor structure comprising:
  a first recrystallized region having a first intrinsic stress disposed over a substrate;
  a second recrystallized region having a second intrinsic stress disposed over the substrate, the second recrystallized region being separated from the first recrystallized region by an isolation trench, the second intrinsic stress being different from the first intrinsic stress;
  a pad oxide layer having a first portion and a second portion, the first portion being disposed over the first recrystallized region and the second portion being disposed over the second recrystallized region;
  a first stressor layer disposed over the first portion of the pad oxide; and
  a second stressor layer disposed over the second portion of the pad oxide, wherein the first and the second stressor layer have different intrinsic stress, and wherein the first and the second stressor layers are separated by the isolation trench including the isolation trench in the substrate.

11. The semiconductor structure of claim 10, wherein the first and the second stressor layers comprise a same material, wherein the second stressor layer comprises a higher germanium concentration than the first stressor layer.

12. The semiconductor structure of claim 10, wherein the first and the second portions are separated by the isolation trench.

13. The semiconductor device of claim 1, further comprising a first transistor formed in the first recrystallized layer, the first transistor comprising a lightly doped source region, a lightly doped drain region, a source region, a drain region, and a charge carrier channel between the source and drain regions, and wherein the second intrinsic stress is aligned substantially parallel to the charge carrier channel, and wherein the first thickness of the first recrystallized layer is larger than a depth of the lightly doped source region of the first transistor but less than a depth of the source region of the first transistor.

14. The semiconductor device of claim 6, further comprising a first transistor in the first portion of the recrystallized silicon layer, and a second transistor in the second portion of the recrystallized silicon layer.

15. The semiconductor device of claim 13, wherein the first transistor comprises an n-channel transistor and the second intrinsic stress is tensile.

16. The semiconductor device of claim 15, wherein the first intrinsic stress is compressive.

17. The semiconductor device of claim 13, wherein the first transistor comprises a PMOS transistor and the second transistor comprises an NMOS transistor.

18. The semiconductor device of claim 17, wherein the second intrinsic stress is tensile.

19. The semiconductor device of claim 18, wherein the first intrinsic stress is compressive.

20. The semiconductor device of claim 14, wherein the first transistor comprises a transistor formed by a method comprising:
  forming an amorphous layer over the substrate;
  forming a stressor layer over the amorphous layer;
  relaxing a stress in a second portion of the stressor layer from a first stress to a second stress to form the second stressor layer;
  recrystallizing the amorphous layer to form the first and second portions of the recrystallized silicon layer;
  removing the stressor layer after recrystallizing the amorphous layer;
  after recrystallizing the amorphous layer, depositing a gate dielectric of the first transistor over the recrystallized silicon layer; and
  depositing a gate electrode over the gate dielectric.

21. The semiconductor device of claim 14, wherein the first and second transistors are formed by a method comprising:
  forming an amorphous layer over the substrate;
  forming a first stressor layer over a first portion of the amorphous layer, wherein the first stressor layer has a third intrinsic stress that is one of compressive and tensile;
  forming a second stressor layer over a second portion of the amorphous layer, wherein the second stressor layer has a fourth intrinsic stress that is different than the first intrinsic stress
  recrystallizing the amorphous layer to form the recrystallized silicon layer;
  removing the first and the second stressor layers after recrystallizing the amorphous layer; and
  forming the first and second transistors in the recrystallized silicon layer.

22. The semiconductor device of claim 13, wherein the first transistor is formed by a method comprising:
  amorphizing the first portion of the upper surface of the first layer comprising a semiconductor body;
  forming the first stressor layer over the amorphized upper surface;
  annealing the upper surface to form the first recrystallized layer;
  removing the first stressor layer after annealing the upper surface;
  after annealing the upper surface, depositing a gate dielectric layer for the first transistor over the recrystallized silicon layer; and
  depositing a gate electrode layer over the gate dielectric layer.

23. The semiconductor device of claim 13, wherein the first transistor is formed by a method comprising:
  amorphizing the first portion of an upper surface of the first layer comprising a semiconductor body;
  forming the first stressor layer over the amorphized upper surface;
  annealing the upper surface to form the first recrystallized layer;
  removing the first stressor layer after the annealing; and
  after annealing the upper surface, forming doped regions of the first transistor.

* * * * *

UNITED STATES PATENT AND TRADEMARK OFFICE
CERTIFICATE OF CORRECTION

| | | |
|---|---|---|
| PATENT NO. | : 7,858,964 B2 | Page 1 of 1 |
| APPLICATION NO. | : 12/368122 | |
| DATED | : December 28, 2010 | |
| INVENTOR(S) | : Knoefler et al. | |

It is certified that error appears in the above-identified patent and that said Letters Patent is hereby corrected as shown below:

In Col. 9, line 60, claim 17, delete "claim 13" and insert --claim 14--.

Signed and Sealed this
Fifth Day of July, 2011

David J. Kappos
*Director of the United States Patent and Trademark Office*